(12) United States Patent
Kegel et al.

(10) Patent No.: US 11,917,794 B2
(45) Date of Patent: Feb. 27, 2024

(54) SEPARATING TEMPERATURE DOMAINS IN COOLED SYSTEMS

(71) Applicant: ADVANCED MICRO DEVICES, INC., Santa Clara, CA (US)

(72) Inventors: Andrew G. Kegel, Bellevue, WA (US); Jeffrey Bialozor, Bellevue, WA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/085,324

(22) Filed: Oct. 30, 2020

(65) Prior Publication Data

US 2022/0142003 A1 May 5, 2022

(51) Int. Cl.
*H05K 7/20* (2006.01)
*H01L 23/44* (2006.01)
*H05K 1/02* (2006.01)

(52) U.S. Cl.
CPC ....... *H05K 7/20372* (2013.01); *H01L 23/445* (2013.01); *H05K 1/0203* (2013.01); *H05K 1/0207* (2013.01); *H05K 7/205* (2013.01)

(58) Field of Classification Search
CPC .. H05K 7/2029; H05K 7/203; H05K 7/20372; H05K 7/205; H05K 1/0203; H05K 1/0207; H01L 23/44–445
See application file for complete search history.

(56) References Cited

U.S. PATENT DOCUMENTS

| | | | | |
|---|---|---|---|---|
| 4,805,420 A | * | 2/1989 | Porter | H01L 23/445 174/15.4 |
| 4,980,754 A | * | 12/1990 | Kotani | H01L 23/445 257/725 |
| 5,040,053 A | * | 8/1991 | Porter | H01L 23/445 257/716 |
| 5,126,830 A | * | 6/1992 | Mueller | H01L 23/445 257/716 |
| 5,212,626 A | * | 5/1993 | Bell | H01L 23/445 174/15.4 |
| 5,504,138 A | * | 4/1996 | Jacobs | C08G 18/324 524/496 |
| 8,787,021 B2 | * | 7/2014 | Murakami | H01L 23/467 361/704 |
| 9,000,660 B2 | * | 4/2015 | Cooke | B64G 1/409 977/932 |
| 10,165,667 B1 | * | 12/2018 | Christiansen | G06F 1/20 |
| 10,390,455 B2 | * | 8/2019 | Chow | H05K 7/20372 |
| 2018/0168070 A1 | * | 6/2018 | Ware | H01L 23/522 |
| 2019/0274232 A1 | * | 9/2019 | Tuttle | H01L 23/445 |
| 2021/0216117 A1 | * | 7/2021 | Alissa | H05K 7/20172 |

* cited by examiner

*Primary Examiner* — Zachary Pape

(57) ABSTRACT

Separating temperature domains in cooled systems, including: cooling at least one first component of a circuit board using a first cooling system; and conductively coupling the at least one first component to at least one second component using a superconductive portion of a power plane of the circuit board.

27 Claims, 5 Drawing Sheets

SEPARATING TEMPERATURE DOMAINS IN COOLED SYSTEMS

BACKGROUND

Certain components such as Central Processing Units may be cooled using cryogenic cooling systems in order to increase performance capabilities. Other components such as Voltage Regulator Modules should be located on a circuit board near the cryogenically cooled components in order to reduce voltage drops due to the distance between components. Proximity to the cryogenic cooling system and its cooled components may cause thermal loss in the Voltage Regulator Modules, potentially causing performance degradation or damage.

DETAILED DESCRIPTION

Figure 1:
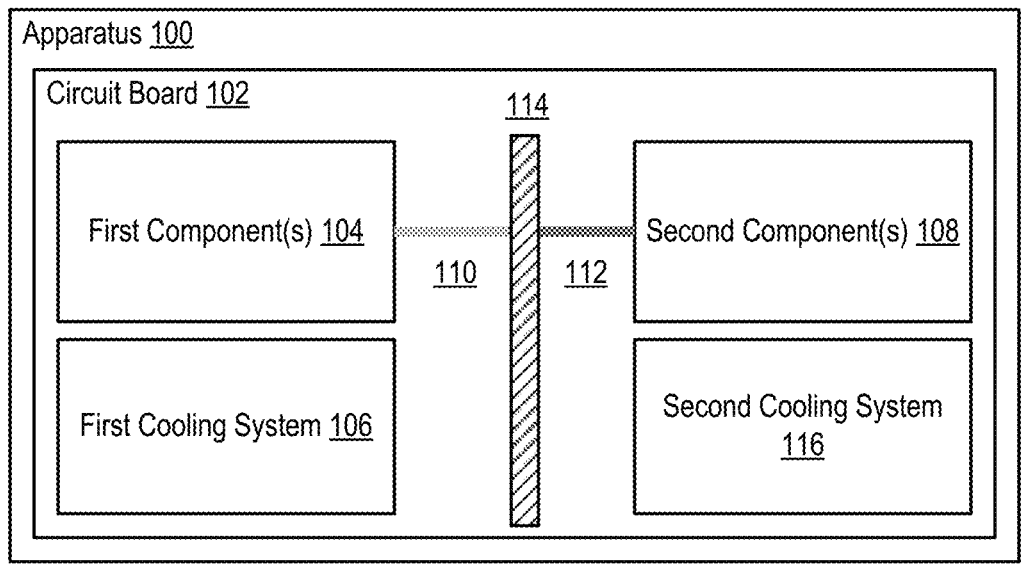
FIG. 1 is a block diagram of an example apparatus for separating temperature domains in cooled systems according to some embodiments.

In some embodiments, a method of separating temperature domains in cooled systems includes: cooling at least one first component of a circuit board using a first cooling system; and conductively coupling the at least one first component to at least one second component using a superconductive portion of a power plane of the circuit board.

In some embodiments, the method further includes cooling the at least one second component using a second cooling system providing a lesser degree of cooling relative to the first cooling system. In some embodiments, conductively coupling the at least one first component to the at least one second component includes bridging the superconductive portion of the power plane of the circuit board to a non-superconductive portion of the power plane that is conductively coupled to the at least one second component. In some embodiments, the method further includes insulating the at least one second component from the first cooling system. In some embodiments, the at least one first component includes a central processing unit (CPU). In some embodiments, the at least one second component includes a voltage regulator module (VRM). In some embodiments, the first cooling system includes a cryogenic cooling system. In some embodiments, the first cooling system provides cooling meeting or falling below a superconductivity threshold associated with the superconductive portion of the power plane. In some embodiments, the first cooling system provides cooling above a superconductivity threshold associated with the superconductive portion of the power plane.

In some embodiments, a circuit board for separating temperature domains in cooled systems includes: at least one first component cooled by a first cooling system; and at least one second component conductively coupled to the first component by a superconductive portion of a power plane of the circuit board.

In some embodiments, the at least one second component is cooled using a second cooling system providing a lesser degree of cooling relative to the first cooling system. In some embodiments, the at least one first component is conductively coupled to the at least one second component by bridging the superconductive portion of the power plane of the circuit board to a non-superconductive portion of the power plane that is conductively coupled to the at least one second component. In some embodiments, the at least one second component is insulated from the first cooling system. In some embodiments, the at least one first component includes a central processing unit (CPU). In some embodiments, the at least one second component includes a voltage regulator module (VRM). In some embodiments, the first cooling system includes a cryogenic cooling system. In some embodiments, the first cooling system provides cooling meeting or falling below a superconductivity threshold associated with the superconductive portion of the power plane. In some embodiments, the first cooling system provides cooling above a superconductivity threshold associated with the superconductive portion of the power plane.

In some embodiments, an apparatus for separating temperature domains in cooled systems includes: a first cooling system; and a circuit board including: at least one first component cooled by the first cooling system; and at least one second component conductively coupled to the first component by a superconductive portion of a power plane of the circuit board.

In some embodiments, the apparatus includes a second cooling system cooling the at least one second component and providing a lesser degree of cooling relative to the first cooling system. In some embodiments, the at least one first component is conductively coupled to the at least one second component by bridging the superconductive portion of the power plane of the circuit board to a non-superconductive portion of the power plane that is conductively coupled to the at least one second component. In some embodiments, the at least one second component is insulated from the first cooling system. In some embodiments, the at least one first component includes a central processing unit (CPU). In some embodiments, the at least one second component includes a voltage regulator module (VRM). In some embodiments, the first cooling system includes a cryogenic cooling system. In some embodiments, the first cooling system provides cooling meeting or falling below a superconductivity threshold associated with the superconductive portion of the power plane. In some embodiments, the first cooling system provides cooling above a superconductivity threshold associated with the superconductive portion of the power plane.

FIG. 1 is a block diagram of a non-limiting example apparatus 100. The example apparatus 100 can be implemented as a variety of computing devices, including mobile devices, personal computers, peripheral hardware components, gaming devices, set-top boxes, and the like. The apparatus 100 includes a circuit board 102. In some embodiments, the circuit board 102 includes a motherboard housing a central processing unit (CPU) of a computing device (e.g., the apparatus 100).

The circuit board 102 includes one or more first components 104. The first components 104 are soldered, inserted into a socket or port, or otherwise installed on or affixed to the circuit board 102. Examples of first components 104 include Central Processing Units (CPUs), Graphics Processing Units (GPUs), Dynamic Random Access Memory (DRAM), or other components. Although the first components 104 are shown as components of the circuit board 102, it is understood that in some embodiments the first components 104 include peripheral components otherwise coupled to the circuit board 102 and cooled by a first cooling system 106, as described below.

A first cooling system 106 is configured to cool the one or more first components 104. In this example, the first cooling system 106 is a cooling system that provides substantially below-freezing cooling to the plurality of first components 104. For example, the first cooling system 106 is a cryogenic cooling ("cryo-cooling") system. A cryogenic cooling system cools associated components by boiling off a liquid or gas. For example, the cryogenic cooling system cools the first components 104 by submerging or contact with liquid nitrogen or another substance. Other substances suitable for cryogenic cooling systems include noble gasses or hydrogen. However, in an embodiment, liquid nitrogen is used for both cost effectiveness and safety.

The circuit board 102 also includes one or more second components 108 conductively coupled to the one or more first components 104 using a power plane of the circuit board 102. Example second components 108 include Voltage Regulator Modules (VRMs), (I/O) Input/Output Controllers, and the like. For example, a Voltage Regulator Module is conductively coupled to a cryo-cooled Central Processing Unit to control how much voltage is provided to or drawn by the Central Processing Unit.

First components 104 such as Central Processing Units benefit from a cryogenically cooled environment by allowing them to run at higher speeds without risk of heat damage thanks to the cooler environment. In contrast, second components 108 such as Voltage Regulator Modules perform better around room temperature, which is significantly higher than the environment provided by a cryo-cooling system. Such lower temperatures degrade the performance of Voltage Regulator Modules or other second components 108 and potentially cause damage.

Existing solutions for addressing the possible damage to second components 108 by a cryogenically cooled environment have several drawbacks. For example, where the second components 108 are moved further from the first components 104, the length of the conductive trace (e.g., copper) between the first components 104 and second components 108 is longer. Though this reduces thermal conductivity of the conductive trace and reduces ambient cooling of the second components 108 by the cryo-cooling system, the increased length of the conductive trace results in a voltage drop between the first components 104 and second components 108. Where the second components 108 (e.g., Voltage Regulator Modules) are constructed with cryo-resistant materials, the cost of such components is increased. Moreover, these cryo-resistant components increase the cooling burden of the cryo-cooling system without affording any performance benefit to the cryo-resistant components.

Instead, in the example circuit board 102, the first components 104 are conductively coupled to the second components 108 using a superconductive portion of the power plane of the circuit board 102. The superconductive portion of the power plane is a portion of the power plane made of superconductive material(s). For example, the superconductive materials include yttrium barium copper oxide, niobium-titanium, niobium-tin, magnesium diboride, and the like. One or more of the first components 104 are conductively coupled to the one or more second components 108 using one or more superconductive traces 110.

In some embodiments, the superconductive traces 110 extend from the first components 104 to the second components 108 such that the second components 108 tap or are attached to the superconductive traces 110. In other embodiments, the superconductive traces 110 are conductively coupled to non-superconductive traces 112 (e.g., copper or other conductive materials used in power planes) using an interconnecting bridge. In some embodiments, interconnections between first components 104 use superconductive portions of the power plane while interconnections between second components 108 use non-superconductive portions of the power plane.

In some embodiments, to further separate the thermal domains between first components 104 and second components 108, a barrier 114 separates or partially separates environments around the first components 104 and second components 108. In some embodiments, the barrier 114 includes insulating or buffering material. In some embodiments, the barrier 114 includes a sealed vacuum. In some embodiments, a second cooling system 116 is configured to cool the second components 118. The second cooling system 116 is configured to cool at a higher temperature (e.g., provide less cooling) compared to the first cooling system 106. For example, the second cooling system 116 includes fans, water cooling, heat sinks, and the like. Thus, the first cooling system 104 cools to below a superconductive threshold for the superconductive material used while the second cooling system 116, where present, cools to above the superconductive threshold.

The use of the superconductive portion of the power plane, when cooled by the first cooling system 106, reduces or eliminates voltage drop for the superconductive portion of the power plane. Moreover, heat transfer between the first components 104 and second components 108 is reduced, allowing the second components 108 to operate at higher, more optimal temperatures. The use of a barrier 114 further reduces ambient heat transfer, allowing for the first components 104 and second components 108 to operate in separate temperature domains.

Although the preceding discussion describes two temperature domains for first components 104 and second components 108, it is understood that, in some embodiments, additional temperature domains are used. For example, additional barriers 114 partition off additional temperature domains. In some embodiments, the additional temperature domains include corresponding cooling systems or are positioned relative to other temperature domains to achieve a desired temperature for components located within.

Figure 2:
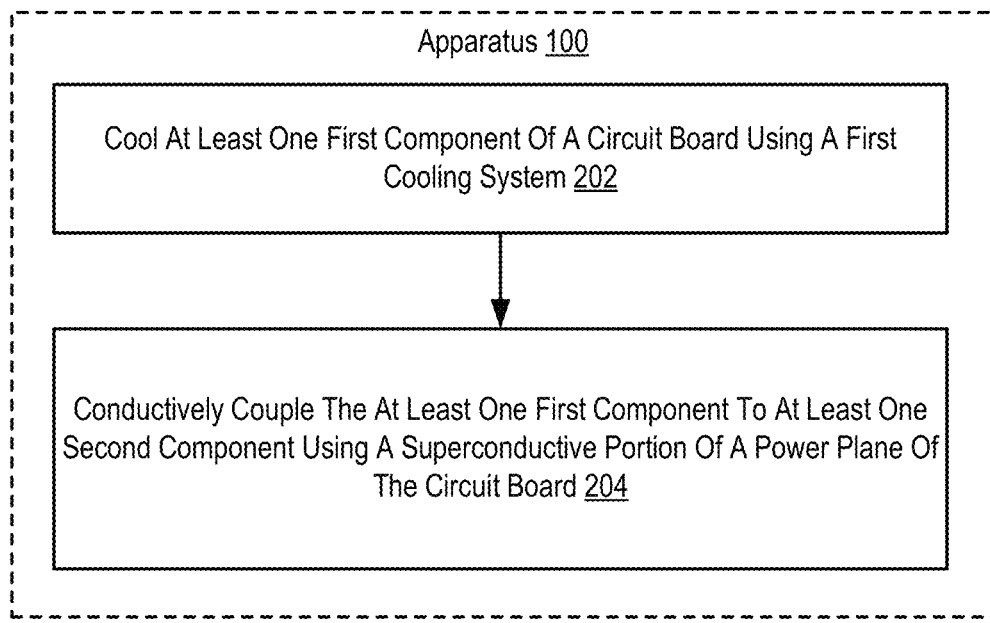
FIG. 2 is a flowchart of an example method for separating temperature domains in cooled systems according to some embodiments.

For further explanation, FIG. 2 sets forth a flow chart illustrating an exemplary method for separating temperature domains in cooled systems that includes cooling 202 (e.g., in an apparatus 100), at least one first component 104 of a circuit board 102 using a first cooling system 106. The first components 104 are soldered, inserted into a socket or port, or otherwise installed on or affixed to the circuit board 102. Examples of first components 104 include Central Processing Units (CPUs), Graphics Processing Units (GPUs), Dynamic Random Access Memory (DRAM), or other components that are provided a performance increase by running at higher temperatures cooled by cryogenic or other sufficiently cooling systems.

The first cooling system 106 is a cooling system configured to cool the first components 102 and superconductive portions of the power plane connected to the first components 102 equal to or below a superconductive temperature threshold. The superconductive temperature threshold is dependent on the superconductive material used in the superconductive portion of the power plane, as will be described in more detail blow. In an example, the first cooling system 106 is a cryogenic cooling ("cryo-cooling") system. A cryogenic cooling system cools associated components by boiling off a liquid or gas. For example, the cryogenic cooling system cools the first components 104 by submerging or contact with liquid nitrogen or another substance. Other substances suitable for cryogenic cooling systems include noble gasses or hydrogen. However, in an embodiment, liquid nitrogen is used for both cost effectiveness and safety.

The method of FIG. 2 also includes conductively coupling 204 the at least one first component to at least one second component 108 of a power plane of the circuit board 102. Example second components 108 include Voltage Regulator Modules (VRMs), (I/O) Input/Output Controllers, and the like. For example, a Voltage Regulator Module (second component 18) is conductively coupled to a cryo-cooled Central Processing Unit (first component 104) to control how much voltage is provided to or drawn by the Central Processing Unit.

The superconductive portion of the power plane is a portion of the power plane of the circuit board 102 made of superconductive material(s). For example, the superconductive materials include yttrium barium copper oxide, niobium-titanium, niobium-tin, magnesium diboride, and the like. Accordingly, the power plane of the circuit board 102 includes one or more superconductive traces 110. The superconductive traces 110 form at least part of a conductive link between the at least one first component 104 and the at least one second component 108.

In some embodiments, the superconductive traces 110 extend from the first components 104 to the second components 108 such that the second components 108 tap or are attached to the superconductive traces 110. In other embodiments, the superconductive traces 110 are conductively coupled to non-superconductive traces 112 (e.g., copper or other conductive materials used in power planes) using an interconnecting bridge. In some embodiments, interconnections between first components 104 use superconductive portions of the power plane while interconnections between second components 108 use non-superconductive portions of the power plane. The first cooling system 106 then cools both the first components 104 as well as superconductive traces 110 interconnecting the first components 104 and portions of superconductive traces 110 coupling the first components 104 and second components 108, thereby reducing or eliminating associated voltage drops.

The use of the superconductive portion of the power plane reduces or eliminates heat conductivity via the power plane between the first components 104 and second components 106. Moreover, voltage drop due to the length of traces between first components 104 and second components 108 is reduced by using at least partially superconductive traces 110 cooled by the first cooling system 106.

Figure 3:
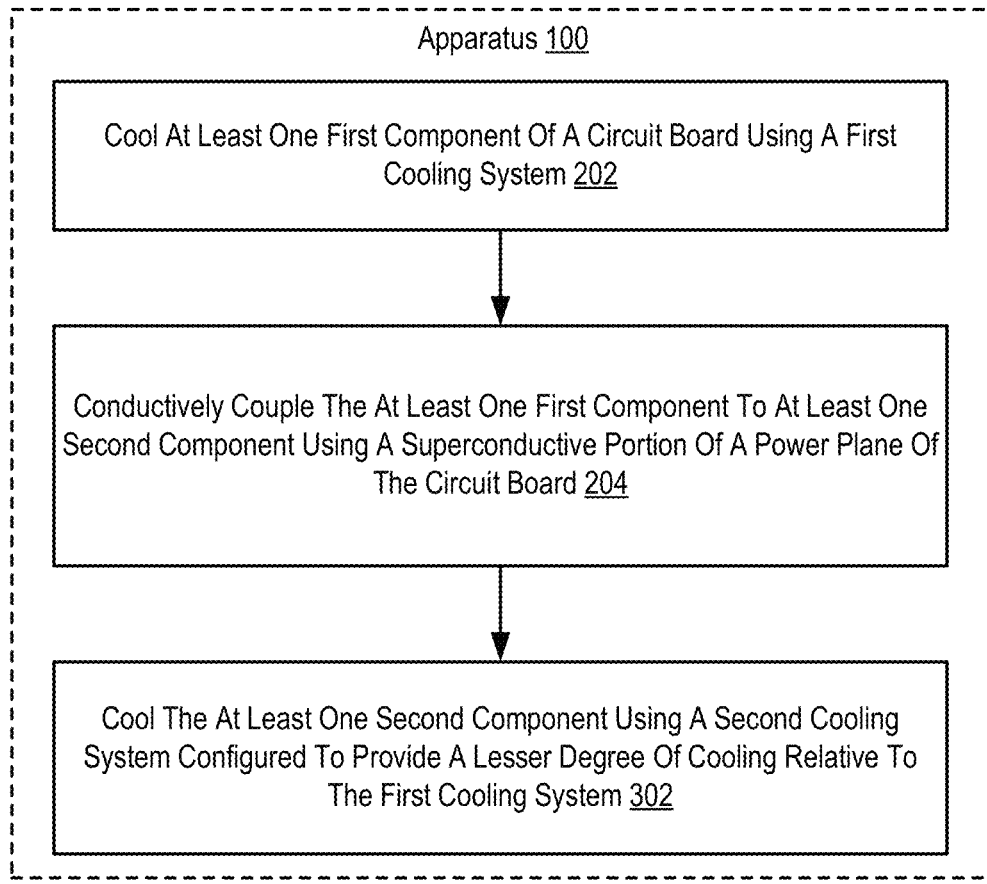
FIG. 3 is a flowchart of an example method for separating temperature domains in cooled systems according to some embodiments.

For further explanation, FIG. 3 sets forth a flow chart illustrating an exemplary method for separating temperature domains in cooled systems that includes cooling 202 (e.g., in an apparatus 100), at least one first component 104 of a circuit board 102 using a first cooling system 106; and conductively coupling 204 the at least one first component to at least one second component 108 of a power plane of the circuit board 102.

The method of FIG. 3 differs from FIG. 2 in that the method of FIG. 3 includes cooling 302 the at least one second component 108 using a second cooling system 116 configured to provide a lesser degree of cooling relative to the first cooling system 106. While the first cooling system 106 is configured to provide cooling at a temperature at or below a superconductive threshold for a superconductive material used in the power plane of the circuit board 102, the second cooling system 116 provides cooling at a temperature above the superconductive threshold. For example, in some embodiments, the second cooling system 116 includes fans, water cooling, heat sinks, and the like. Thus, second components 108 are able to be cooled to operating temperatures greater than the operating temperatures of the first components 104.

Figure 4:
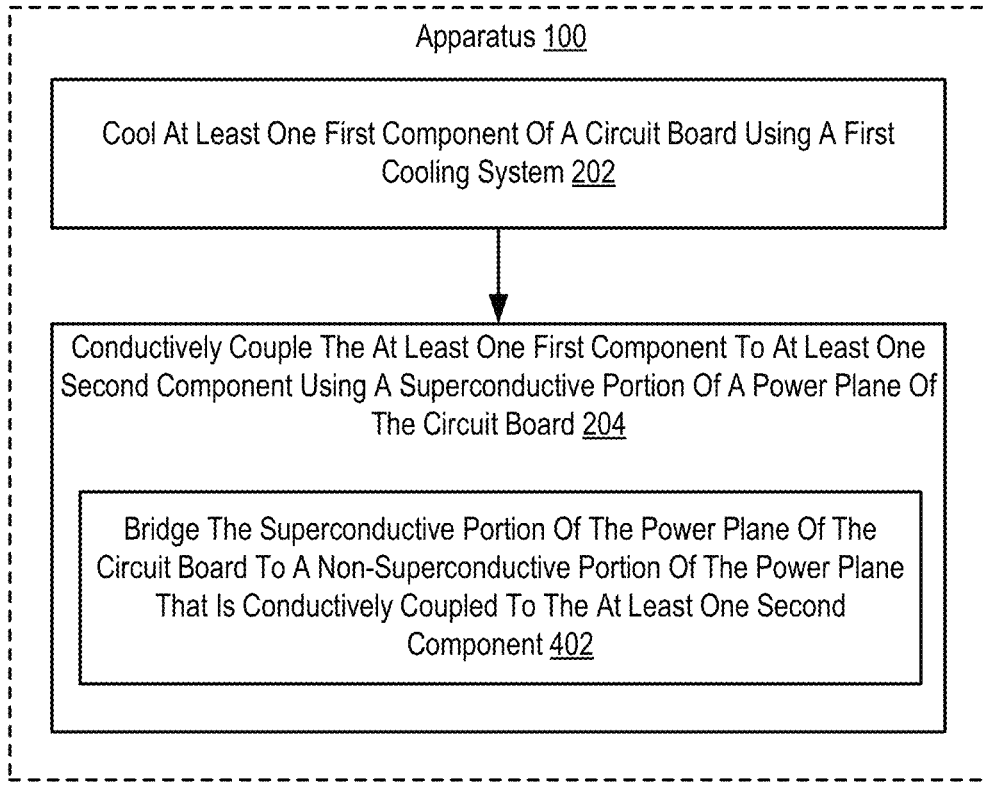
FIG. 4 is a flowchart of an example method for separating temperature domains in cooled systems according to some embodiments.

For further explanation, FIG. 4 sets forth a flow chart illustrating an exemplary method for separating temperature domains in cooled systems that includes cooling 202 (e.g., in an apparatus 100), at least one first component 104 of a circuit board 102 using a first cooling system 106; and conductively coupling 204 the at least one first component to at least one second component 108 of a power plane of the circuit board 102.

The method of FIG. 4 differs from FIG. 2 in that conductively coupling 204 the at least one first component to at least one second component 108 of a power plane of the circuit board 102 includes bridging 402 the superconductive portion of the power plane of the circuit board 102 to a non-superconductive portion of the power plane that is conductively coupled to the at least one second component. For example, assume a superconductive trace 110 is conductively coupled to a first component 102 and a non-superconductive trace 112 is conductively coupled to a second component 108. A bridging interconnect conductively couples the superconductive trace 110 to the non-superconductive trace 112, thereby forming a conductive connection from the first component 102 to the second component 108.

Figure 5:
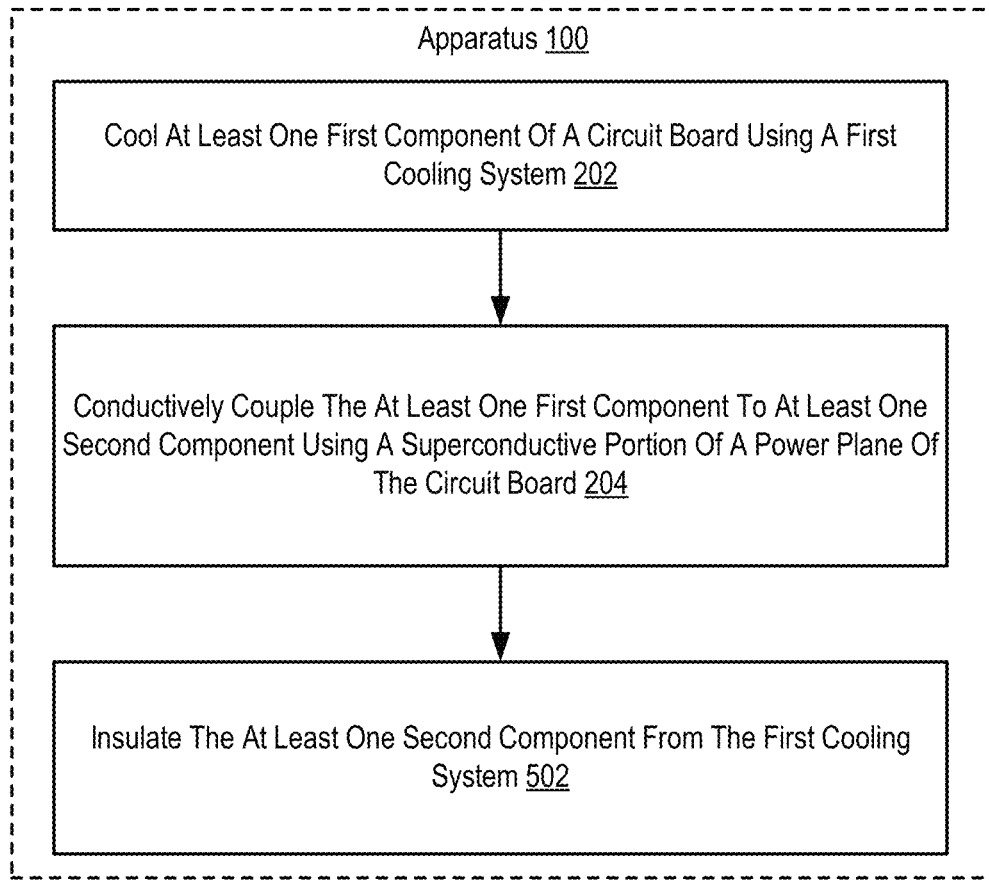
FIG. 5 is a flowchart of an example method for separating temperature domains in cooled systems according to some embodiments.

For further explanation, FIG. 5 sets forth a flow chart illustrating an exemplary method for separating temperature domains in cooled systems that includes cooling 202 (e.g., in an apparatus 100), at least one first component 104 of a circuit board 102 using a first cooling system 106; and conductively coupling 204 the at least one first component to at least one second component 108 of a power plane of the circuit board 102.

The method of FIG. 5 differs from FIG. 2 in that the method of FIG. 5 includes insulating 502 the at least one second component 108 from the first cooling system 106. For example, in some embodiments, to further separate the thermal domains between first components 104 and second components 108, a barrier 114 separates or partially separates environments around the first components 104 and second components 108. In some embodiments, the barrier 114 includes insulating or buffering material. In some embodiments, the barrier 114 includes a sealed vacuum. Thus, the barrier 114 insulates the second components 108 from heat loss caused by the first cooling system 106.

In view of the explanations set forth above, readers will recognize that the benefits of separating temperature domains in cooled systems include:

Improved performance of a computing system by protecting selected components from heat loss and thermal conductivity caused by cryogenic cooling of other components.

Lowered cryo-cooling system requirements and operating cost by reducing the total amount of cryogenic cooling capacity required.

Improved performance of a computing system by allowing components to operate at effective and efficient temperatures most appropriate to each.

Improved performance of computing system by preventing unintentional cooling of components through the use of a barrier between thermal zones.

Improved performance of a computing system by avoiding the cost of cooling components not optimally operating at cryo temperatures.

Improved performance of a computing system by reducing voltage drops between components due to the distance and materials used in conductive traces connecting the components.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method for separating temperature domains in cooled systems, the method comprising:
    cooling at least one first component of a circuit board and a superconductive portion of a power plane of the circuit board using a first cooling system, wherein the first cooling system is configured to provide cooling meeting or falling below a superconductivity threshold associated with the superconductive portion of the power plane of the circuit board; and
    conductively coupling the at least one first component to at least one second component of the circuit board using the superconductive portion of the power plane of the circuit board, wherein the superconductive portion of the power plane is a high temperature cuprate superconductor, wherein conductively coupling the at least one first component to the at least one second component comprises bridging, using an interconnecting bridge, the superconductive portion of the power plane to a non-superconductive portion of the power plane, the non-superconductive portion coupled to the at least one second component.

2. The method of claim 1, further comprising cooling the at least one second component using a second cooling system configured to provide a lesser degree of cooling relative to the first cooling system.

3. The method of claim 2, wherein the second cooling system is configured to provide cooling above a superconductivity threshold associated with the superconductive portion of the power plane.

4. The method of claim 1, further comprising insulating the at least one second component from the first cooling system using a thermal barrier.

5. The method of claim 4, wherein the thermal barrier includes a sealed vacuum.

6. The method of claim 1, wherein the at least one first component comprises a central processing unit (CPU).

7. The method of claim 1, wherein the at least one second component comprises a voltage regulator module (VRM).

8. The method of claim 1, wherein the first cooling system comprises a cryogenic cooling system.

9. The method of claim 1, wherein the first cooling system is configured to cool the at least one first component and the superconductive portion of the power plane to a temperature meeting or falling below the superconductivity threshold associated with the superconductive portion of the power plane.

10. The method of claim 1, wherein the superconductive portion of the power plane of the circuit board includes superconductive traces to be cooled by the first cooling system to a temperature at or below the superconductivity threshold.

11. A circuit board for separating temperature domains in cooled systems, the circuit board comprising:
    at least one first component configured to be cooled by a first cooling system;
    at least one second component conductively coupled to the at least one first component by a superconductive portion of a power plane of the circuit board, wherein the superconductive portion of the power plane is a high temperature cuprate superconductor, wherein the superconductive portion of the power plane is configured to be cooled by the first cooling system, and wherein the first cooling system is configured to provide cooling meeting or falling below a superconductivity threshold associated with the superconductive portion of the power plane of the circuit board; and
    an interconnecting bridge configured to conductively couple the at least one first component to the at least one second component by bridging the superconductive portion of the power plane to a non-superconductive portion of the power plane, the non-superconductive portion coupled to the at least one second component.

12. The circuit board of claim 11, wherein the at least one second component is configured to be cooled by a second cooling system configured to provide a lesser degree of cooling relative to the first cooling system.

13. The circuit board of claim 12, wherein the second cooling system is configured to provide cooling above a superconductivity threshold associated with the superconductive portion of the power plane.

14. The circuit board of claim 11, further comprising a thermal barrier between the at least one second component and the first cooling system.

15. The circuit board of claim 14, wherein the thermal barrier includes a sealed vacuum.

16. The circuit board of claim 11, wherein the at least one first component comprises a central processing unit (CPU).

17. The circuit board of claim 11, wherein the at least one second component comprises a voltage regulator module (VRM).

18. The circuit board of claim 11, wherein the first cooling system comprises a cryogenic cooling system.

19. The circuit board of claim 11, wherein the first cooling system is configured to cool the at least one first component and the superconductive portion of the power plane to a temperature meeting or falling below the superconductivity threshold associated with the superconductive portion of the power plane.

20. The circuit board of claim 11, wherein the superconductive portion of the power plane of the circuit board includes superconductive traces to be cooled by the first cooling system to a temperature at or below the superconductivity threshold.

21. An apparatus for separating temperature domains in cooled systems, the apparatus comprising:
    a first cooling system; and
    a circuit board comprising:
        at least one first component configured to be cooled by the first cooling system;
        at least one second component conductively coupled to the at least one first component by a superconductive portion of a power plane of the circuit board, wherein the superconductive portion of the power plane is a high temperature cuprate superconductor, wherein the superconductive portion of the power plane is configured to be cooled by the first cooling system, and wherein the first cooling system is configured to provide cooling meeting or falling below a superconductivity threshold associated with the superconductive portion of the power plane of the circuit board;
    an interconnecting bridge configured to conductively couple the at least one first component to the at least one second component by bridging the superconductive portion of the power plane to a non-superconductive portion of the power plane, the non-superconductive portion coupled to the at least one second component; and
    a thermal barrier including a sealed vacuum between the at least one second component and the first cooling system.

22. The apparatus of claim 21, further comprising a second cooling system configured to cool the at least one second component and configured to provide a lesser degree of cooling relative to the first cooling system.

23. The apparatus of claim 22, wherein the second cooling system is configured to provide cooling above a superconductivity threshold associated with the superconductive portion of the power plane.

24. The apparatus of claim 21, wherein the at least one first component comprises a central processing unit (CPU).

25. The apparatus of claim 21, wherein the at least one second component comprises a voltage regulator module (VRM).

26. The apparatus of claim 21, wherein the first cooling system comprises a cryogenic cooling system.

27. The apparatus of claim 21, wherein the first cooling system is configured to cool the at least one first component and the superconductive portion of the power plane to a temperature meeting or falling below the superconductivity threshold associated with the superconductive portion of the power plane.

* * * * *